United States Patent [19]

Kaltenecker et al.

[11] Patent Number: 4,785,264
[45] Date of Patent: Nov. 15, 1988

[54] DUAL FET OSCILLATOR

[75] Inventors: Robert S. Kaltenecker, Mesa, Ariz.; Robert E. Stengel, Ft. Lauderdale, Fla.; Ralph T. Enderby, Ft. Lauderdale, Fla.; James S. Irwin, Ft. Lauderdale, Fla.

[73] Assignee: Motorola, Inc., Schaumburg, Ill.

[21] Appl. No.: 55,206

[22] Filed: May 28, 1987

[51] Int. Cl.[4] .............................................. H03B 5/12
[52] U.S. Cl. ....................... 331/117 FE; 331/116 FE
[58] Field of Search ........ 331/116 R, 116 FE, 117 R, 331/117 FE

[56] References Cited

U.S. PATENT DOCUMENTS 4,216,443  8/1980  Zaderej .................... 331/116 FE X Primary Examiner—Eugene R. LaRoche
Assistant Examiner—David Mis
Attorney, Agent, or Firm—Daniel K. Nichols

[57] ABSTRACT

A dual FET oscillator includes a first J-FET and a second J-FET connected to it as a source follower. A turned circuit is connected to the gate of the first J-FET and to the second J-FET. Bias voltage is supplied to both J-FET's. Schottky diodes are connected to both J-FET's to limit gate-source voltage.

4 Claims, 1 Drawing Sheet

DUAL FET OSCILLATOR

BACKGROUND OF THE INVENTION

This invention relates to oscillator circuits general and particularly to J-FET (Junction Field Effect Transistor) oscillators. The use of a JFET's in oscillator circuits at lower frequencies is well known. However, at higher frequencies, such as the UHF range, J-FET's are not utilized due to low gain and temperature instability.

One known approach to improve gain at this frequency range utilizes a bipolar transistor in parallel with a J-FET. The use of a bipolar transistor degrades the oscillator noise characteristics.

SUMMARY OF THE INVENTION

This dual FET oscillator circuit includes two J-FET's for providing increased gain and temperature stability, due to the higher gain, at higher frequencies of operation.

The dual FET oscillator includes resonance means connected to a gate of a first J-FET and to a second J-FET. A bias voltage means is connected to the J-FET's. The second J-FET is serially connected to the first J-FET as gain stage.

In one aspect of the invention, the second J-FET is connected as a source follower. In another aspect of the invention, Schottky diodes are connected to each of the J-FET's to limit gate-source voltages. In still another aspect of the invention, the oscillator comprises a Colpitts oscillator. In yet another aspect of the invention, the oscillator is a UHF oscillator.

DESCRIPTION OF THE PREFERRED EMBODIMENT

Figure 1:
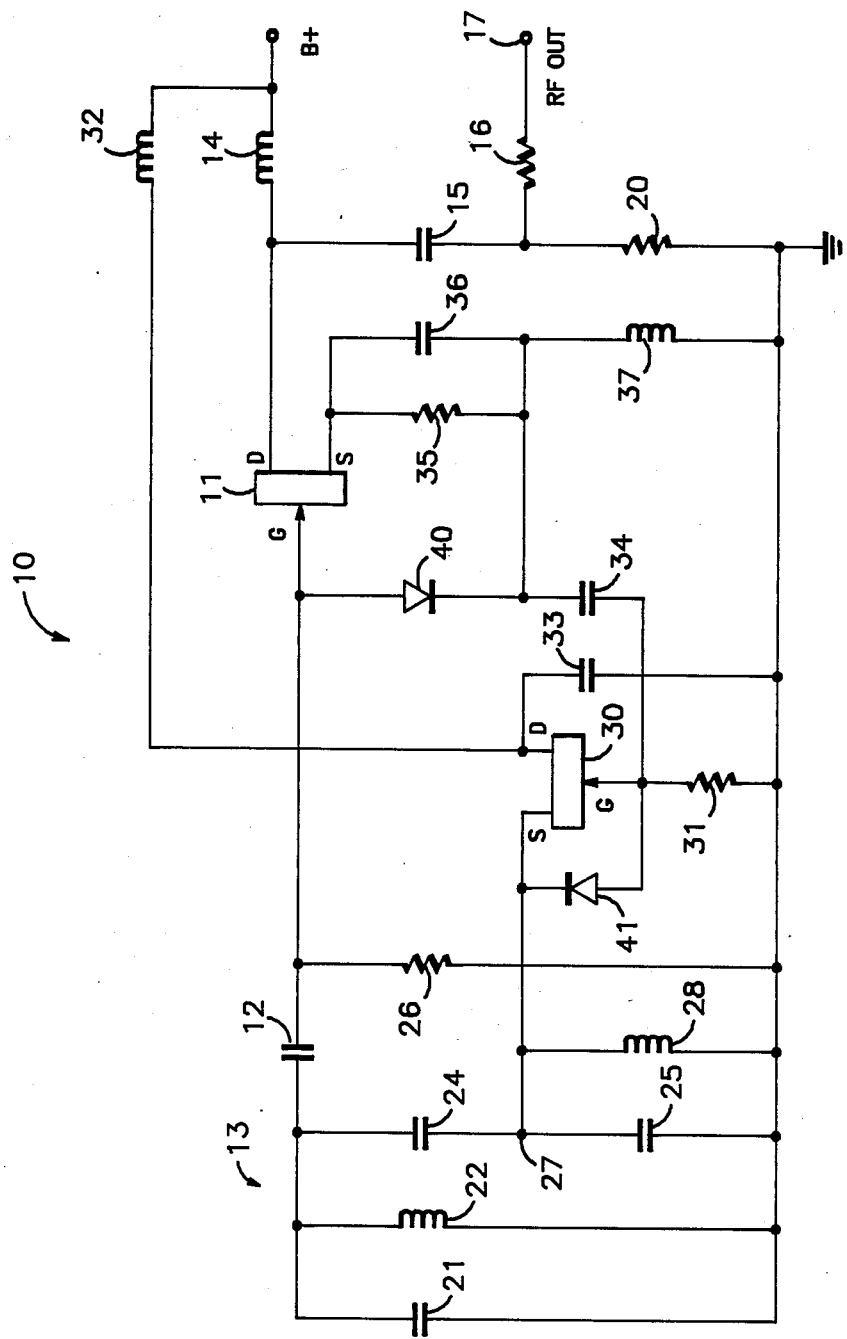
FIG. 1 is an electrical schematic view of an oscillator in accordance with the present invention.

Referring now by characters of reference to the drawing, it will be understood that the oscillator circuit, generally indicated by 10, includes a J-FET (transistor) 11 which has its gate connected by coupling capacitor 12 to a tank circuit 13, comprising resonance means. The drain of J-FET 11 is connected to a B+ supply, constituting bias voltage means, as by RF choke 14, while the output signal is coupled by capacitor 15 and a resistor 16 to the output 17. A low impedance resistor 20, coupled between ground and the junction of capacitor 15 and resistor 16, provides an AC ground return path.

Tank circuit 13 includes parallel connected capacitor 21 and inductor 22. The resonant frequency of the oscillator 10 is determined by capacitor 21 and inductor 22 and the distributed reactance of the amplifier circuit 10. Series capacitors 24 and 25 are connected between the output of tank circuit 13 and ground for providing impedance matching and serve as a voltage divider. A resistor 26 is connected between the gate of transistor 11 and ground and has a relatively high resistance to provide a DC gate ground connection.

The junction 27 of capacitors 24 and 25 is operatively coupled to the source of J-FET 11. A second J-FET 30 provides a gain stage coupling the junction 27 to J-FET 11. The source of J-FET 30 is connected to junction 27 and to choke 28 which is the DC ground connection to the source. Its gate is connected to ground by resistor 31. An bf choke 32 supplies the B+ voltage to the drain of J-FET 30 while AC signals are bypassed to ground by capacitor 33.

The gate of J-FET 30 is coupled to the source of J-FET 11 by capacitor 34 and the parallel connection of a resistor 35 and a capacitor 36. A choke 37 is connected between resistor 35 and ground provides a DC supply path to the source of transistor 11.

Schottky diodes 40 and 41 have the anodes connected to the gates of transistors 11 and 30 respectively. The cathode of diode 40 is connected to the junction of capacitors 34 and 36, resistor 35 and choke 37. The cathode of diode 41 is connected to the source of J-FET 30. The Schottky diodes 40 and 41 are utilized to limit the positive going voltages across the gate-source junctions of J-FET's 11 and 30 to hold the positive voltage going voltage to 0.2 volts, thereby preventing forward biasing of the gate-source junction of transistors 11 and 30. The use of Schottky diodes to prevent gate-sorce current flow is fully discussed in a copending U.S. patent application Ser. No. 55,207 entitled "FET Oscillator Circuit", by the same applicants filed on the same day as this application the disclosure of which is hereby incorporated by reference as if fully set out herein.

While it is believed the features and functional advantages of the J-FET oscillator are apparent from the foregoing description of parts, for completeness of disclosure a brief description of the operation of the circuit will be given.

In operation, J-FET 30 constitutes a source follower that is used to increase the loop gain of the circuit. The Schottky diodes 40 and 41 provide the limiting mechanism for positive peak signals, preventing forward conduction of the gate-source junctions of J-FET's 11 and 30. The pinch-off voltages of the J-FET's 11 and 30 provide the limiting mechanism for negative peak signals. This arrangement assures good noise performance for the oscillator 10.

In addition to good noise performance, the oscillator 10, is insensitive to overdrive levels, and has sufficient gain to be useful at frequencies in the UHF range, and an increased operating temperature range.

The oscillator 10 can be constructed as a VCO (voltage controlled oscillator) by adding a varactor in series with capacitor 21. Oscillator 10 is a Colpitts oscillator as tapped capacitance is utilized. If desired, other oscillator types could be utilized.

We claim as our invention:

1. A dual FET oscillator suitable for use at UHF frequencies including first and second J-FET's each having gate, drain and sorce connections comprising:
   resonance means connected to the gate of the first J-FET and to the second J-FET,
   bias voltage means connected to the first and second FET's, and
   the second J-FET being connected to the first J-FET as a source follower.

2. A dual FET oscillator as defined in claim 1, in which:
   Schottky diodes are connected to each of the J-FET's to limit gate-source voltages.

3. A dual FET oscillator as defined in claim 1, in which:
   the oscillator comprises a Colpitts oscillator.

4. A dual FET oscillator as defined in claim 1, in which:
   the oscillator has an output coupled to the drain of the first J-FET.

* * * * *